US006168833B1

(12) United States Patent
Leushake et al.

(10) Patent No.: US 6,168,833 B1
(45) Date of Patent: Jan. 2, 2001

(54) PROCESS FOR COATING WITH CERAMIC VAPORIZING MATERIALS

(75) Inventors: Uwe Leushake, Leverkusen; Walter Luxem, Troisdorf; Claus-Jürgen Kröder; Wolf-D. Zimmermann, both of Köln, all of (DE)

(73) Assignee: DLR Deutsche Forschungsanstalt für Luft-und Raumfahrt e.V. (DE)

( * ) Notice: Under 35 U.S.C. 154(b), the term of this patent shall be extended for 0 days.

(21) Appl. No.: 09/250,648

(22) Filed: Feb. 16, 1999

Related U.S. Application Data

(62) Division of application No. 08/873,185, filed on Jun. 11, 1997, now abandoned.

(30) Foreign Application Priority Data

Jun. 13, 1996 (DE) .............................. 196 23 587

(51) Int. Cl.⁷ .................................... C23C 16/30
(52) U.S. Cl. .................................. 427/248.1; 427/249.5; 427/255.31; 427/255.394
(58) Field of Search ............................. 427/376.1, 376.2, 427/248.1, 255.31, 249.5, 255.394

(56) References Cited

U.S. PATENT DOCUMENTS

| | | | |
|---|---|---|---|
| 4,626,451 | * 12/1986 | Tanaka et al. | 427/126.2 |
| 4,676,994 | 6/1987 | Demaray . | |
| 5,102,483 | * 4/1992 | Sawada et al. | 427/63 |
| 5,106,654 | * 4/1992 | Isenberg | 427/376.2 |
| 5,106,794 | 4/1992 | Oizumi et al. . | |
| 5,384,306 | 1/1995 | Konig et al. . | |
| 5,389,585 | 2/1995 | Konig et al. . | |
| 5,418,003 | 5/1995 | Bruce et al. . | |
| 5,472,477 | 12/1995 | Konig . | |
| 5,525,374 | * 6/1996 | Ritland et al. | 427/376.1 |
| 5,616,426 | * 4/1997 | Tenhover et al. | 427/577 |

FOREIGN PATENT DOCUMENTS

| | | |
|---|---|---|
| 39 08 322 A1 | 10/1989 | (DE) . |
| 42 14719 A1 | 11/1993 | (DE) . |
| 43 02 167 | 2/1994 | (DE) . |
| 42 14725 C2 | 4/1995 | (DE) . |
| 42 14724 C2 | 5/1995 | (DE) . |

OTHER PUBLICATIONS

Johner, G.,, Wilms, V.: Keramikschichten zur Wärmedämmung in Turbinegehäussen. In: Technische Keramik, Vulkan–Verlag, Essen 1988, S. 311–316 (with translation).

Lenk, R.: Hot Moulding—An Interesting Forming Process. In:DKG 72, 1995, No. 10, S. 636–639.

Patent Abstracts of Japan, vol. 017, No. 162 (C–1042), Mar. 30, 1993 and Japan 04 323366 A (Asahi Glass Co., Ltd.), Nov. 12, 1992.

Patent Abstracts of Japan, vol. 016, No. 194 (C–0938), May 11, 1992 and Japan 04 028865A (Mutsubishi Kasei Corp.), Jan. 31, 1992.

European Search Report in EP97 10 8972, Sep. 18, 1997.

\* cited by examiner

*Primary Examiner*—Timothy Meeks
*Assistant Examiner*—Bret Chen
(74) *Attorney, Agent, or Firm*—Banner & Witcoff, Ltd.

(57) ABSTRACT

A process for coating an object with ceramic material vaporized from an ingot of the ceramic material. The process comprises the steps of (a) evaporating the material by melting the surface of the ingot with an intense heat source; and (b) depositing the evaporated material upon the object as a coating. The ingot comprises an unsintered mixture of at least two powder fractions of at least 50% to 90% by volume of a coarse-grained powder and 10% to 50% by volume of a fine-grained powder. The average particle diameter, $d_{50}$, of the fine-grained powder is at most one third the average particle diameter of the coarse-grained powder. The powders are metal oxides, transition metal oxides, nitrides, carbides, borides, suicides or combinations thereof

16 Claims, No Drawings

PROCESS FOR COATING WITH CERAMIC VAPORIZING MATERIALS

This application is a division of Ser. No. 08/873,185 filed Jun. 11, 1997, now abandoned.

FIELD OF THE INVENTION

The present invention pertains to ceramic vaporizing materials (ingots) for the coating of surfaces by means of physical vapor deposition, a process for the preparation thereof and the use of the ceramic vaporizing materials for the coating of objects.

BACKGROUND OF THE INVENTION

The coating of materials using ceramics has recently gained much importance in many different fields of applications. In this way, well-aimed combinations of properties can be achieved which are not possible when using uncoated materials.

Different coating methods have become established for the different fields of applications, for example, thermal spraying or physical vapor deposition for the preparation of thick films. Physical vapor deposition (PVD) has advantages over the other thick film methods in the field of coating controlled microstructures of thick films. The material to be coated (substrate) is situated in a vapor plume forming over a superheated melt, and condensation from the vapor phase occurs due to the difference in temperature. A reaction with the gas being present can occur while still in the gas phase or during the condensation of the vaporized particles (reactive vaporization). This is used primarily in oxidic ceramics in order to achieve a stochiometric deposition of the oxides which in part highly dissociate. For producing the superheated melt, high-energy radiation, e.g. laser radiation or electron radiation, can be used.

The material to be vaporized must be present in a form suitable for the particular process. In smaller plants (laboratory scale), the material is frequently vaporized from granules (coarse powder) which are present in a crucible. This process variant hardly requires a special preliminary processing of the material to be vaporized, but has the decisive drawback that a uniform and continuous coating process over an extended period of time is not possible. However, these criteria are of critical importance in the industrial application and in the preparation of thick films.

Therefore, a different concept of material supply has been developed for industrial and semi-industrial plants. The material to be vaporized is processed into round rods (ingots), for example, having diameters of 2 inches (~50 mm) or 2.5 inches (~63 mm) and lengths of about 25 cm. These are molten at the surface thereof in a laterally arranged crucible, open at the bottom, and can be continuously supplied through a conveying mechanism which is integrated in the coating chamber. Thus, a homogeneous and constant coating of objects becomes possible over an extended period of time.

It has been shown, however, that the preparation of the ingots and the ingot properties resulting therefrom have a distinct influence on the vaporizing performance of the ingots themselves and the quality of the deposited films. A calm, non-sputtering melting bath generation is required for the vaporization process. The melt should be chemically homogeneous which can be achieved both by the use of chemically homogenized powders and, when inhomogeneous powders are used, by a homogenization taking place in the melt (by convection).

The non-steady operational phases (heating, cooling and transient power cutoff by flashovers) have proven particularly critical for the use of ingots. In such phases, disastrous failure by breakage of the ingots frequently occurs in conventional dense or partially sintered ceramic materials due to the pronounced difference in temperature. For this reason, a thermal shock resistance which is sufficiently high for such loads is defined as a requirement to be met by the ingot. This is generally realized by a sufficient residual porosity.

During the coating of the objects, further reactions take place in the ingot. In the PVD process, the vaporization rate is proportional to the temperature, and therefore, it is sought to superheat the melting bath as highly as possible (up to 4000° C.) in order to achieve high coating rates. Due to the low thermal conductivity of the ceramic materials, a steep temperature gradient forms in the zone beneath the melting bath. Correspondingly, different processes take place in a region narrowly limited in space. A corresponding local thermal expansion appears for the whole thermally strained range, corresponding to the respective local temperature. At temperatures above the onset temperature of sintering, a counter-acting volume shrinking takes place due to sintering processes. The interplay of these mechanisms can result in a failure of the ingot during the coating process.

A further requirement to be met by the ingot is a constant density throughout the height of the ingot. Further, for mechanical engineering reasons, certain requirements must be demanded from the accuracy of ingot geometry and the handling properties (especially green strength). The ingots are generally brought to the desired dimensions by mechanical processing (turning on a lathe or circular grinding).

Commercially available are only yttria ($Y_2O_3$) partially stabilized zirconia ingots which are prepared by a cumbersome processing and sintering method. DE 43 02 167 C1 describes a target made of zirconia and a process for the preparation thereof. For the preparation of heat-insulating layers on refractory materials by electron beam physical vapor deposition (EB-PVD), targets of zirconia are described which are to be thermal shock resistant. Such targets contain from 0.5 to 25% by weight of yttria besides zirconia, both with a purity of at least 99.8%. A fraction of 50 to 80% by weight of the zirconia must be present as a monoclinic phase, and the targets must have a sintered density of from 3.0 to 4.5g/cm$^3$. The preparation of the targets is performed by compression-molding and sintering zirconia/yttria mixtures into corresponding molded articles. It has been described to be of advantage to use powders the average particle size, $d_{50}$, of which is below 50 μm wherein more than 90% by weight of the particles must be 0.4 μm or larger in size, and more than 50% by weight must be 1 μm or larger in size.

U.S. Pat. No. 4,676,994 describes a dense ceramic film on substrates, the film having a density of more than 94% of the theoretical density. No further specifications are given with respect to the target to be used.

From DE 39 08 322 A1, sintered parts made of zirconia are known which serve as targets for the vapor deposition of optical layers. The zirconia used may contain from 50 to 2000 ppm of calcium oxide and must have a purity of at least 99%. In addition, the targets must have a density of more than 4.9 g/cm$^3$ (80% relative density). Lower densities are said to have a negative effect on the quality of the vapor deposited films. When 0.2% of calcium oxide is used, cracks will form in the target so that stable high-temperature phases of zirconia which are required for the preparation of heat-insulating layers cannot be produced with these targets.

The term "sintering" represents an important process step in powder metallurgy which is a thermal densification of powders or powder pellets by diffusion processes, usually without involving molten phases. A special case is liquid-phase sintering. As a rule, the sintering temperature is within a range of from half to three forths of the melting temperature of the lowest-melting material. Three phenomenological stages of sintering can be distinguished:

1. Growth of particle contacts by the formation of so-called sintering bridges.

2. Formation of a continuous pore skeleton. The original particles lose their identities, and shrinking occurs with the formation of new grain boundaries.

3. Pores become round or are eliminated with further shrinking. The remaining pore space increasingly becomes inaccessible from outside (closed pores). In the borderline case, complete densification occurs.

To avoid oxidations, this process can be performed under inert gas atmosphere or in vacuo. Sintering is a process step which is used with both metals and ceramics. It is different from densification by compression-molding in that solid bridges are formed by diffusion wherein all of surface, grain boundary and bulk diffusion may play a role. Depending on the sintering temperature and activation energy of the corresponding paths of diffusion, the different mechanisms contribute to densification.

An increase of the efficiencies of combustion engines or turbines can only be realized through an increased combustion temperature. Therefore, recent research shows developments resulting in novel and more complex layer systems in the range of thermal protective layers. This includes both the use of other stabilizers for the yttria stabilized zirconia conventionally used to date and the development of completely novel ceramic thermal protective layers. Thus, the preparation of ingots of corresponding chemical compositions gains fundamental importance for this development and its later industrial application. It is only by the development of novel processing methods that a basis for the further activities in this area has been provided.

The preparation method of the partially stabilized zirconia ingot commercially available currently cannot be extended to other chemical compositions or ceramic materials due to the powder- and material-specific sintering treatments performed and is very complex and cost-intensive due to the large number of sintering and calcining treatments performed.

SUMMARY OF THE INVENTION

Thus, it has been the object of the present invention to provide thermal shock resistant ceramic vaporizing materials (ingots) which can be prepared with low costs and have a defined chemical composition, allowing for a wide variety of chemical compositions of the coating materials due to the wide range of possible starting materials to be selected.

In a first embodiment, the above object is achieved by ceramic vaporizing materials (ingots) for the coating of objects by means of physical vapor deposition, comprising an unsintered mixture of at least two powder fractions consisting of from 50 to 90% by volume of a coarse-grained powder and from 10 to 50% by volume of a fine-grained powder wherein the average particle diameter, $d_{50}$, of said fine-grained powder is at most one third of the average particle diameter of said coarse-grained powder.

The core of the present invention is based on a special powder processing. The material to be vaporized must be present in at least two powder fractions which are distinct from each other in a defined way. Both powders should have as narrow as possible a spread of the respective particle sizes. One powder should have as large as possible an average diameter, the other should have as small as possible a diameter.

When bimodal powders (powders having two different particle size distributions) are mixed, pellet green densities can be achieved which are higher than the green densities of the respective starting powders when certain mixing ratios of the powders are used. This is based on the accommodation of the smaller powder particles in the spaces between adjacent larger particles. Thus, relative pellet green densities can be adjusted which otherwise can be achieved only through partial sintering treatments. Further, the green density can be varied within a wide range of densities via the mixing ratio of the powders and thus can be matched to the requirements for the conventional ingots. Due to the versatility of the method, many different powders can be matched to one another and correspondingly processed. For this reason, it is not possible to give an upper limit of the ratio of powder particle sizes. In theory, an infinitely large ratio of the two powder particle sizes is even desirable. In the case when more than two powder fractions are mixed (polymodal particle size distribution), the proportions of the mixing ratios have to be matched to the number of powder fractions.

The two powders must be homogenized by a wet or dry grinding/mixing process wherein no change of the preliminarily adjusted particle size distribution should possibly occur (appropriate choice of the grinding/mixing process and the parameters). In order that the powder mixture can be molded more homogeneously, a molding aid can be added in a sufficient amount in the liquid or solid state. When liquid suspensions are used, it must be removed again by an appropriate method after the mixing. The bimodal powder mixture is screened prior to molding and subsequently granulated to a free-flowing state. In addition to more homogeneous molding, the use of molding aids also avoids separation of the individual powder fractions.

Molding is performed either by axial pressing with subsequent isostatic densification or directly by isostatic pressing. Due to the lack of plastic deformation of ceramic powders, a variation of the molding parameters results only in a minor influencing of the green density. Limits result from the fact that too high a molding pressure has a negative effect on the performance of the ingots due to overpressing while too low a molding pressure does not yield the green strength required for the further processing. It is therefore necessary to optimize the molding pressure in accordance with the requirements and the geometry. When flat ingots are prepared (height<diameter), a combination of axial and isostatic pressing is recommendable. With elongated ingots, direct isostatic pressing is recommendable in order to avoid the negative effects of mold friction.

Subsequently, the pellet can be mechanically processed to the desired dimensions wherein processing either with circular grinding machines and by turning on a lathe is possible. The green strength of the ingots is sufficient for mechanical processing, in particular due to the molding aids used.

Finally, the optionally added molding aid must be removed again by heat treatment, optionally under vacuum, wherein such calcination has to be performed clearly below the onset temperature of sintering. The temperature and temperature engineering are selected such that the added molding aids can evaporate and exit from the pellet without damaging it.

The particular advantages of the present invention are:
the principle can be transferred to a wide variety of ceramic materials which may be contemplated for vaporization;
preparation at room temperature without sintering is simple;
further advantages result from the lack of sintering bridges:
volume changes arising from phase transitions do not cause failure of the ingot, and therefore, the phase composition of the powders used must not be further specified;
lower thermal conductivity of the ingot and thus improved control of the melting bath;
lower thermal conductivity results in lower thermal losses;
reduction of the thermal strains forming during the steady and non-steady operational phases due to separation or displacement of the powder particles with respect to each other;
reduction or stopping of crack propagation;
thermal shock resistance is but insignificantly influenced by the density;
the use of coarser powder particles results in a reduction of the sintering tendency of the highly thermally strained zone and thus the stress thereby generated is reduced.

DETAILED DESCRIPTION OF THE INVENTION

A preferred embodiment of the ceramic vaporizing materials according to the invention is characterized in that said mixture of at least two powder fractions comprises a coarse-grained powder in an amount of from 60 to 85% by volume and a fine-grained powder in an amount of from 15 to 40% by volume. Within this range of amounts, particularly good ceramic vaporizing materials can be prepared which have a very high relative density and thus are capable of providing a large quantity of material to be vaporized.

In the vaporizing materials of the prior art, the relative density of the ingot plays a decisive role since the necessary thermal shock resistance is adjusted through an adequate residual porosity. Thus, it is not customary in the prior art to prepare ceramic vaporizing materials having relative densities of more than about 60 to 70%. By means of the present invention, however, it is possible to achieve relative densities of from 50 to 80%, in particular from 70 to 80%. Such high relative densities are obtainable because the fine-grained powder intrudes in cavities of the coarse-grained powder, and thus the relative green density of the ceramic materials according to the invention can be adjusted to a range which is above the relative green densities of the individual powders.

Another preferred embodiment of the ceramic vaporizing materials according to the invention is characterized in that the average particle diameter, $d_{50}$, of the fine-grained powder is at most one fifth to one twentieth, in particular one tenth, of the average particle diameter of the coarse-grained powder.

Usually, the particles form a monodisperse powder in the nm, $\mu$m or mm range so that a distribution density curve exists which is characterized by a minimum diameter of the particles and a maximum diameter of the particles. It is particularly preferred according to the present invention to adjust the absolute particle diameters of the coarse-grained powder such that they exhibit less than 20%, especially less than 10%, of overlapping with the absolute particle diameters of the fine-grained powder. It is possible to use particles consisting exclusively of fine-grained powder, if desired, wherein part of the fine-grained powder is processed in a special manner in a separate process step. It is possible to sinter that portion of the powder mixture which represents the coarse-grained powder fraction in a separate process step, if desired, in order to obtain a coarse-grained powder corresponding to the specification.

Because a bimodal powder is employed, it is possible according to the invention that the coarse-grained powder and the fine-grained powder may have the same or different chemical compositions. Thus, it is possible, for example, to prepare both powders from zirconia (unstabilized/partially stabilized/fully stabilized) by correspondingly mixing different powder fractions. It is equally possible, however, to include different ceramic materials in the different powder fractions, thus to include chemically different powders together in one homogeneous mixture. In addition, it is similarly possible, in principle, to provide inhomogeneous powder mixtures which offer the opportunity of applying gradient coatings on surfaces within a single ceramic vaporizing material. With different chemical compositions through the length of the ingots, a corresponding coating can be achieved.

According to the present invention, virtually all known ceramic materials can be employed. In particular, there may be mentioned the metal and/or transition metal oxides, nitrides, carbides, borides and/or silicides. In the above-mentioned prior art, it is documented that zirconia undergoes a phase transition (mono-clinic-tetragonal) which causes a large volume change (3–5%) within a temperature range of 900 to 1200° C. which is the reason why it is reported in the prior art to be difficult to prepare high-density sintered parts of larger geometries from pure zirconia. According to the invention, however, the preparation of unstabilized, e.g., yttria-free, zirconia ingots with relative green densities in the range of from 60 to 80% is successful since the ceramic vaporizing materials (ingots) according to the invention do not undergo sintering in the preparation process, and thus such a phase transition does not occur. When the ingots are then employed for coating purposes, only the surface of the ingots is molten because of their extremely poor thermal conductivity. In the underlying deeper layers, the powder particles are more or less free to move with respect to each other due to the lack of sintering bridges so that any minute breakage sites arising will not break further, i.e. are stopped.

Another embodiment of the invention is a process for the preparation of ceramic vaporizing materials as defined above. In particular, a homogeneous mixture of a coarse-grained powder and a fine-grained powder is compression-molded, optionally using molding aids, the green body is mechanically processed to the desired dimensions, and any present molding aids are removed by a heat treatment below the onset temperature of sintering. Of particular importance in the realization of the preparation process is the gentle temperature engineering in the removing of the molding aids which is clearly below the onset temperature of sintering of the powders used. By selecting appropriate pressure and temperature conditions, sintering of the ceramic materials employed can be safely avoided, and a complete removal of the molding aids can be ensured.

In a particular embodiment of the present invention, the mixture of coarse-grained and fine-grained powder is first axially pressed at room temperature and subsequently repressed isostatically. Isostatic pressing is a known alternative to axial pressing in which an uneven densification of the molded article occurs in the powder due to inner strains and mold frictions which extends both in axial and in radial direction. In isostatic molding, the choice of the approximate shape is effected through a corresponding elastic basic mold. This is then subjected to a pressure which is equal in all directions in a sealed and evacuated condition in a liquid container which results in a uniform densification and symmetric shrinking of the material. Since the mold is made of an elastic material, mostly latex, and behaves in a pressure-elastic, i.e. flexible, way, the geometry of the blank is not exactly defined at the surfaces, especially at the outer edge, which is in contrast to dry pressing. For this reason, the green body (molded article, unsintered) is machine-reprocessed, its strength and hardness being sufficient for the corresponding treatment at this time.

As an alternative to sequential pressing which proceeds from axial pressing at room temperature followed by isostatic pressing, it is also possible to prepare the ingots directly by isostatic pressing.

It is particularly preferred according to the present invention to use molding aids per se known in the prior art. There may be mentioned primarily waxes, soaps and highly viscous liquids etc. which are employed, in particular, in an amount of up to 10 parts by weight, preferably 2 to 6 parts by weight, based on the powder mixture. These molding aids are removed from the ingot by an appropriate heat treatment clearly below the onset temperature of sintering of the ceramic powders.

Another embodiment of the present invention consists in the use of ceramic vaporizing materials as defined above for the coating of objects, especially in the optical area or in turbine construction, both flying and stationary turbines, by the action of high-energy radiation.

For improving the efficiency of modern jet engines, a reduction of fuel consumption is sought. One possibility is to increase the combustion temperature in the combustion chamber. This temperature could be continuously increased in the past by alloy developments and cooling of components. The nickel superalloys are used in turbine construction in the range of highly loaded components and are employed at temperatures of up to 95% of their melting points. Known in the prior art are coatings on such turbine blades made of ceramic materials having an extremely low thermal conductivity (1 to 2 $Wm^{-1}$) which are externally applied to the turbine blades as heat-insulating layers, thus jacketing them. The thickness of these layers is 0.1 to 0.3 mm, for example, whereby it is possible to achieve a temperature reduction of the metallic substrate by 100 to 200° C. Preferably used as the coating material is zirconia which has a high heat-insulating property and a thermal expansion which is similar to that of the nickel superalloy. According to the invention, a stabilization of zirconia for use in these coatings is not required. In the meantime, thermal protective layers have also been used in stationary gas turbines. In the same way, the ceramic vaporizing material may also be employed in the optical area, especially for coating spectacle lenses.

EXAMPLES

In the following examples, the applicability of the developed process in the preparation of partially stabilized zirconia ingots commercially available currently and novel chemical compositions will be described.

Example 1

In this example, the preparation of a zirconia ingot is described which comprises 3 mole % of yttria and has a content of hafnium oxide (less than 2 mole %) which is due to the powder preparation procedure. This is a chemical composition similar to that of the commercially available ingots, however, the stabilizer content is somewhat lower.

The commercially available powders (A) and (B) used for the mixtures had different chemical compositions. The first powder (A) which had been fine at first with an average particle diameter, $d_{50}$, of 0.3 μm (BET 16 $m^2/g$) contains 4 mole % of yttria, the fine powder (B) is unstabilized with an average particle diameter, $d_{50}$, of 0.3 μm (BET 12 $m^2/g$). In contrast to most of the available zirconia powders, these powders (B) were characterized by a low hafnium oxide content which is due to the different preparation process and starting materials.

The coarse powder to be used was prepared by ourselves. From powder (A) which was present in spherical particles due to spray drying performed by the manufacturer, a coarse powder (A*) having an average particle diameter, $d_{50}$, of 51.8 μm was prepared by sintering a loose packing at 1450° C. in air for 1 hour.

As the first step in the preparation of the ingots, in general, the influence of the powder mixing ratios on the green density of pellets is studied. The procedure will be described here in an illustrative way. For the preliminary studies, 20 gram each of the respective powder mixture was processed and correspondingly small pellets (2–5 grams) were prepared. For molding, a flying mold with 16.5 mm of diameter was used.

The respective powder mixtures and molding aids (1 part by weight of SS, 1 part by weight of ST, 2 parts by weight of PEG 600, 2 parts by weight of EP (product designations of manufacturers)) were mixed wet in an alcoholic solution (isopropanol). In this case, mixing was effected using ULTRATURRAX, but it may also be performed in ball mills or planetary mills with an appropriate choice of milling parameters. Subsequently, the powder suspension was dried under vacuum in a rotary evaporator, screened and granulated in a tumbler mixer. The pellets were subjected to preliminary axial pressing at 50 MPa and subsequently to isostatic densification at 200 MPa in evacuated latex coats. The green density for different powder mixtures was determined after the removal of the molding aids and is set forth in table 1. It was found that the density adjusted in the commercially available ingots could already be achieved as a pellet green density for a wide range of mixing ratios. It has to be noted, however, that an yttria content of the ingots resulted which was independent of the powder mixing ratio.

TABLE 1

| amount of coarse-grained powder [vol. %] | amount of fine-grained powder [vol. %] | absolute green density [$g/cm^3$] | relative green density, % |
|---|---|---|---|
| 0 | 100 | 3.00 | 49.6 |
| 50 | 50 | 3.77 | 62.3 |
| 65 | 35 | 4.03 | 66.6 |
| 75 | 25 | 4.14 | 68.5 |
| 85 | 15 | 4.09 | 67.5 |
| 95 | 5 | 3.94 | 65.1 |

For the preparation of one ingot, 200 g of a powder mixture consisting of 65% by volume of coarse-grained powder (A*) and 35% by volume of fine-grained powder (B) as well as molding aids (6% by weight of wax) was processed according to the above-described procedure. This powder mixture was subjected to preliminary axial pressing in a flying female mold (55 mm of diameter) and subsequently to isostatic densification. The relative green density of the ingot was found to be 65%. The deviation of the green density as compared to the experiments performed before can be explained by the different diameter-to-height ratio during pressing.

After mechanical treatment by turning on a lathe, the molding aids were removed from the ingot by a heat treatment in air (at 450° C. within 900 min, maintained for 2 hours, free cooling in the oven). With the parameters commonly used in the vaporization of yttria partially stabilized zirconia, test vaporizations were performed with the ingot which proceeded in a very satisfactory way. The ingot was repeatedly heated and cooled and proved to be thermal shock resistant. The melting bath itself was calm and free of sputtering.

Example 2

In example 2, the preparation of an unstabilized zirconia ingot will be described. This grade is not commercially available currently. Two different unstabilized commercially available zirconia powders were used which are characterized, in particular, by very low hafnium oxide contents (<100 ppm). The coarse powder as supplied had a specific surface area of 6.4 $m^2/g$ with an average particle diameter, $d_{50}$, of 0.57 μm. From this starting powder, a coarser powder (A*) was prepared by sintering at 1450° C. in air for 1 h. Due to the elongated particle shapes formed by sintering, the average particle size after sintering could not be exactly determined by means of a laser granulometer and sizing, but was assumed to be at least 98.3 μm. However, the specific surface area was smaller than 0.5 $m^2/g$. The fine powder (B) was characterized by a specific surface area of 12 $m^2/g$ and an average particle diameter, $d_{50}$, of 0.30 μm. In analogy to example 1, 200 g of a powder mixture (65% of coarse, sintered powder (A*) and 35% of fine powder (B)) was processed and compression-molded into an ingot. This powder mixture was subjected to preliminary pressing with an axial pressure of about 40 MPa and subsequently to isostatic densification at 200 MPa. With a mold diameter of 55 mm, an ingot diameter of 49.1 mm resulted after molding so that further shaping by machining could be dispensed with. The molding aids were removed by subsequent heat treatment (at 450° C. within 900 min, maintained for 2 hours, free cooling in the oven), and the relative density of the ingot was determined to be 59%.

Based on the parameters established for the vaporization of partially stabilized zirconium dioxide, a vaporization experiment was performed. The behavior during the vaporization was good, and the melting bath was calm and free of sputtering. The ingot proved to be highly thermal shock resistant, withstanding without problems the rapid cooling and subsequent heating caused by cutoffs of the electron beam gun or flashovers.

Example 3

By the preparation and successful vaporization of an alumina ingot, the general, i.e. material-independent, character of the developed preparation process could be pointed out. In analogy to examples 1 and 2, two different starting powders were also used. The fine powder (B) was highly pure alumina having a specific surface area of 9 to 12 $m^2/g$ and an average particle diameter, $d_{50}$, of 0.6 μm.

In analogy to examples 1 and 2, the second powder was subjected to an additional annealing in order to render it coarser. Starting with powder type (A) (pure alumina, BET= 0.8 to 1.2 $m^2/g$), the coarse powder fraction (Ag) was prepared by annealing a loose powder packing at 1450° C. in air for 1 hour. The annealed powder had an average particle diameter, $d_{50}$, of 22.0 μm.

From 130 g (65%) of the coarse powder (Ag) (1450° C./1 h), 70 g (35%) of the fine powder (B) and 6 parts by weight of molding aids (wax), a powder mixture was prepared in analogy to example 1. The processed powder was subjected to preliminary pressing with an axial pressure of about 40 MPa and subsequently to isostatic densification at 200 MPa. With a mold diameter of 55 mm, an ingot diameter of 48.8 mm resulted after molding so that further shaping by machining could be dispensed with. The molding aids were completely removed by subsequent heat treatment in air (at 450° C. within 900 min, maintained for 2 hours, free cooling in the oven), and the relative density of the ingot was determined to be 63%.

Based on the experiences in the vaporization of zirconia, new parameters were developed for the vaporization of alumina. This was necessary because of the different evaporation behavior of alumina as compared with zirconia which can already be seen from the clearly lower melting point. The ingot prepared as described above was subjected to test vaporizations. The melting bath formed was generally calm, however, a small number of benign bubbles (i.e. slow emergeance, minimum sputtering) occurred. After cooling, the ingot had a glass-like solidified surface with a fine network of cracks in the range of the former melting bath. Further below, some larger cracks appeared which did not result in disastrous failure of the ingot, however, and therefore were not critical. Despite thermal conductivity being higher than that of zirconia by one order of magnitude, the melting pool formed was small which can be attributed to the clear reduction of thermal conductivity due to the porosity and especially to the lack of solid bridges which are otherwise present after sintering.

What is claimed is:

1. A process for coating an object with ceramic material vaporized from an ingot of said ceramic material, comprising the steps of:
    (a) evaporating said ceramic material by melting the surface of said ingot with an heat source; and
    (b) depositing the evaporated material upon the object as a coating,
    wherein said ingot comprises an unsintered mixture of at least two powder fractions of at least 50% to 90% by volume of a coarse-grained powder and 10% to 50% by volume of a fine-grained powder;
    wherein the average particle diameter, $d_{50}$, of said fine-grained powder is at most one third the average particle diameter of said coarse-grained powder; and
    wherein said powders are selected from the group consisting of metal oxides, transition metal oxides, nitrides, carbides, borides, silicides and combinations thereof.

2. A process according to claim 1, wherein said unsintered mixture comprises a coarse-grained powder in the amount of 60% to 85% by volume and a fine-grained powder in the amount of 15% to 40% by volume.

3. A process according to claim 1, wherein the relative green density of said unsintered mixture is in the range of 50% to 80%.

4. A process according to claim 3, wherein the relative green density of said unsintered mixture is in the range of 70% to 80%.

5. A process according to claim 1, wherein said average particle diameter, $d_{50}$, of said fine-grained powder is at most one-fifth to one-tenth the average particle diameter of said coarse-grained powder.

6. A process according to claim 1, wherein the absolute particle diameters of said coarse-grained powder exhibit less than 20% overlap with the absolute particle diameters of said fine-grained powder.

7. A process according to claim 6, wherein the absolute particle diameters of said coarse-grained powder exhibit less than 10% overlap with the absolute particle diameters of said fine-grained powder.

8. A process according to claim 1, wherein said powder fractions have the same chemical composition.

9. A process according to claim 1, wherein said powder fractions have different chemical compositions.

10. A process according to claim 1, wherein said powder fractions consist essentially of unstabilized, yttria-free zirconia.

11. A process according to claim 1, wherein said powder fractions consist essentially of alumina.

12. A process according to claim 1, wherein said ingot is prepared by a forming process comprising the steps of:
   (a) mixing said coarse-grained powder and said fine-grained powder together to form a homogeneous powder mixture;
   (b) compression-molding said powder mixture, optionally using a molding aid, to form a green body;
   (c) mechanically processing said green body into a desired ingot shape; and
   (d) heat-treating said ingot below the onset temperature of sintering to remove any molding aids therefrom.

13. A process according to claim 12, wherein said compression-molding step comprises subjecting said powder mixture to isostatic pressing.

14. A process according to claim 13, wherein said compression-molding step comprises subjecting said powder mixture to axial pressing before subjecting said powder mixture to isostatic pressing.

15. A process according to claim 12, wherein said molding aid is selected from the group consisting of waxes, soaps, liquids and combinations thereof in an amount of up to ten parts by weight based on said powder mixture.

16. A process according to claim 15, wherein said molding aid comprises two to six parts by weight based on said powder mixture.

* * * * *

UNITED STATES PATENT AND TRADEMARK OFFICE
CERTIFICATE OF CORRECTION

PATENT NO. : 6,168,833 B1
DATED : January 2, 2001
INVENTOR(S) : Uwe Lueshake et al.

Page 1 of 1

It is certified that error appears in the above-identified patent and that said Letters Patent is hereby corrected as shown below:

<u>Title page,</u>
ABSTRACT, "suicides" has been replaced with -- silicides --.

Signed and Sealed this

Twenty-ninth Day of January, 2002

*Attest:*

*Attesting Officer*

JAMES E. ROGAN
*Director of the United States Patent and Trademark Office*